United States Patent
Yang

(10) Patent No.: US 7,493,588 B2
(45) Date of Patent: Feb. 17, 2009

(54) MIXING AND MATCHING METHOD AND INTEGRATION SYSTEM FOR PROVIDING BACKUP STRATEGIES FOR OPTICAL ENVIRONMENTS AND METHOD FOR OPERATING THE SAME

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 633 days.

(21) Appl. No.: 11/195,069

(22) Filed: Aug. 1, 2005

(65) Prior Publication Data
US 2007/0026322 A1    Feb. 1, 2007

(51) Int. Cl.
G06F 17/50    (2006.01)

(52) U.S. Cl. .......................................... 716/19; 716/21
(58) Field of Classification Search .................... 716/19, 716/21; 430/5, 22, 30
See application file for complete search history.

(56) References Cited

U.S. PATENT DOCUMENTS

| | | | |
|---|---|---|---|
| 6,699,627 B2 | 3/2004 | Smith et al. ................. | 430/22 |
| 7,013,439 B2 * | 3/2006 | Robles et al. ................. | 716/4 |
| 7,093,229 B2 * | 8/2006 | Pang et al. ................. | 716/21 |
| 7,142,283 B2 * | 11/2006 | Shiozawa ................. | 355/53 |
| 7,245,356 B2 * | 7/2007 | Hansen ................. | 355/67 |
| 7,318,214 B1 * | 1/2008 | Prasad et al. ................. | 716/21 |
| 2005/0003278 A1 * | 1/2005 | Hwang et al. ................. | 430/5 |

* cited by examiner

Primary Examiner—Sun J Lin
(74) Attorney, Agent, or Firm—J.C. Patents

(57) ABSTRACT

A mixing-and-matching method for an optical environment group is disclosed in this invention. The optical environment group has at least a primary optical environment having a first numerical aperture (NA) and a first off-axis illumination (OAI) mode and at least one backup optical environment having a second NA and a second OAI mode. The method comprises steps of providing information including a first critical dimension behavior on a mask (a first MCD behavior) with respect to a design rule and a first critical dimension behavior on a developed photoresist (a first DCD behavior) obtained by using the primary optical environment with the mask and modifying the first MCD behavior to be a second MCD behavior according to the information, wherein a second DCD behavior obtained by using the backup optical environment with the modified mask having the second MCD behavior is as same as the first DCD behavior.

23 Claims, 11 Drawing Sheets

| | primary optical environment with Std.mask | | backup optical environment with Std.mask | | backup optical environment with modified mask | |
|---|---|---|---|---|---|---|
| | NA=0.75 $\sigma_{in}/\sigma_{out}$=0.55/0.85 | | NA=0.70 $\sigma_{in}/\sigma_{out}$=0.55/0.85 | | NA=0.70 $\sigma_{in}/\sigma_{out}$=0.55/0.85 | |
| No. | MCD | DCD | MCD | DCD | MCD | DCD |
| 1 | 118 | 129 | 118 | 131 | 120 | 132 |
| 2 | 120 | 132 | 120 | 140 | 116 | 131 |
| 3 | 120 | 133 | 120 | 135 | 120 | 134 |
| 4 | 120 | 133 | 120 | 135 | 120 | 132 |
| 5 | 120 | 129 | 120 | 132 | 120 | 132 |
| 6 | 120 | 130 | 120 | 133 | 120 | 133 |
| 7 | 120 | 129 | 120 | 130 | 120 | 130 |
| 8 | 120 | 130 | 120 | 130 | 120 | 130 |

| | primary optical environment with Std.mask | | backup optical environment with Modified Mask and adjusted OAI mode | |
|---|---|---|---|---|
| | NA=0.75 $\sigma_{in}/\sigma_{out}$=0.55/0.85 | | NA=0.70 $\sigma_{in}/\sigma_{out}$=0.64/0.88 | |
| No. | MCD | DCD | MCD | DCD |
| 1 | 118 | 129 | 120 | 130 |
| 2 | 120 | 132 | 116 | 128 |
| 3 | 120 | 133 | 120 | 130 |
| 4 | 120 | 133 | 120 | 130 |
| 5 | 120 | 129 | 120 | 132 |
| 6 | 120 | 130 | 120 | 133 |
| 7 | 120 | 129 | 120 | 130 |
| 8 | 120 | 130 | 120 | 130 |

FIG. 4A

|  | primary optical environment with Std.mask | | backup optical environment with Std.mask | |
|---|---|---|---|---|
|  | NA=0.75 $\sigma_{in}/\sigma_{out}$=0.55/0.85 | | NA=0.70 $\sigma_{in}/\sigma_{out}$=0.64/0.88 | |
| No. | MCD | DCD | MCD | DCD |
| 1 | 118 | 129 | 118 | 129 |
| 2 | 120 | 132 | 120 | 135 |
| 3 | 120 | 133 | 120 | 134 |
| 4 | 120 | 133 | 120 | 131 |
| 5 | 120 | 129 | 120 | 130 |
| 6 | 120 | 130 | 120 | 132 |
| 7 | 120 | 129 | 120 | 130 |
| 8 | 120 | 130 | 120 | 130 |

FIG. 6A

MIXING AND MATCHING METHOD AND INTEGRATION SYSTEM FOR PROVIDING BACKUP STRATEGRIES FOR OPTICAL ENVIRONMENTS AND METHOD FOR OPERATING THE SAME

BACKGROUND OF THE INVENTION

1. Field of Invention

The present invention relates to an integration system and the method for operating the same. More particularly, the present invention relates to a mixing-and-matching method and an integration system for providing backup strategies for optical environments and the method for operating the same.

2. Description of Related Art

With the semiconductor manufacturing technology trending towards a node size of about 130 nm or even below 130 nm, the demands for an optical environment, such as scanner, possessing high numerical aperture (NA) is increased since the optical environment with higher NA possesses better resolution even though pitch dimension variation is getting small. However, the scanner is very expensive, not to mention a scanner with a relatively high NA. Hence, most of the time, there is only one scanner with the relative high NA in a semiconductor manufacturing factory. Therefore, once the scanner with the relative high NA is breakdown, the throughput of a production line using this breakdown scanner will be seriously affected. It is important to find out a backup tool/scanner for the primary tool/scanner in case the primary tool/scanner is down.

Conventionally, in order to matching the behavior of the critical dimension on the developed photoresist/the etched process layer formed over the wafer (DCD/ECD) under the primary optical environment having high NA to the behavior of DCD/ECD under the backup optical environment having low NA, the optimal NA of the primary optical environment is sacrificed and the NA of the primary optical environment is tuned down to a middle NA to accommodate the DCD/ECD performance under the primary optical environment to the DCD/ECD performance under the backup optical environment. Nevertheless, under this circumstance, the primary optical environment with a middle NA cannot show the optimal performance that it should be. Hence the resolution of the primary optical environment with the middle NA is not as high as users expect.

SUMMARY OF THE INVENTION

Accordingly, at least one objective of the present invention is to provide a mixing-and-matching method capable of providing a backup optical environment rendering a behavior of critical dimension on a developed photoresist or an etched process layer (DCD/ECD) as same as the DCD/ECD performance under the primary optical environment.

At least another objective of the present invention is to provide a method for providing a backup strategy for at least one primary optical environment. By properly modifying the standard photomask and/or adjusting OAI mode of the backup optical environment, the DCD/ECD by using the backup optical environment is similar to that under the primary optical environment.

To achieve these and other advantages and in accordance with the purpose of the invention, as embodied and broadly described herein, the invention provides a mixing-and-matching method for a optical environment group. The optical environment group has at least a primary optical environment having a first numerical aperture (NA) and a first off-axis illumination (OAI) mode and at least one backup optical environment having a second NA and a second OAI mode. The method comprises steps of providing information including a first critical dimension behavior on a mask with respect to a design rule and a second critical dimension behavior on a developed photoresist obtained by using the primary optical environment with the mask and then modifying the mask to convert the first critical dimension behavior into a third critical dimension behavior according to the information, wherein a fourth critical dimension behavior on another developed photoresist obtained by using the backup optical environment with the modified mask having the third critical dimension behavior is as same as the second critical dimension behavior.

In the present invention, the first NA is an optimal NA of the primary optical environment and the first NA is larger than the second NA. Further, the step of modifying the mask further comprises a step of adjusting the second OAI mode of the backup optical environment to be a third OAI mode. Also, the third OAI mode is stronger than the second OAI mode when the first NA is larger than the second NA.

The present invention also provides a mixing-and-matching method for a optical environment group. The optical environment group has at least a primary optical environment having a first numerical aperture (NA) and a first off-axis illumination (OAI) mode and at least one backup optical environment having a second NA and a second OAI mode. The method comprises steps of providing information including a first critical dimension behavior on a mask with respect to a design rule and a second critical dimension behavior on a developed photoresist obtained by using the primary optical environment with the mask. Then, when the design rule possesses a high demand on a product critical dimension, the mask is modified to convert the first critical dimension behavior into a third critical dimension behavior according to the information, wherein a fourth critical dimension behavior on another developed photoresist obtained by using the backup optical environment with the modified mask having the third critical dimension behavior is as same as the second critical dimension behavior. Alternatively, when the design rule possesses a low demand on the product critical dimension, the second OAI mode of the backup optical environment is adjusted to be a third OAI mode, wherein a fifth critical dimension behavior on another developed photoresist obtained by using the backup optical environment with the mask and the third OAI mode approximates to the second critical dimension behavior.

In the present invention, the first NA is an optimal NA of the primary optical environment and the first NA is larger than the second NA. Moreover, the third OAI mode is stronger than the second OAI mode when the first NA is larger than the second NA. In addition, the step of modifying the mask further comprises a step of adjusting the second OAI mode of the backup optical environment to be a fourth OAI mode, wherein the fourth OAI mode is stronger than the second OAI mode when the first NA is larger than the second NA.

The present invention further provides a method for providing a backup strategy for at least a primary optical environment having a first numerical aperture (NA) and a first off-axis illumination mode for a fist design rule. Under the primary optical environment with a mask having a first critical dimension behavior on the mask corresponding to the first design rule, a second critical dimension behavior on a developed photoresist is generated. The backup strategy includes a plurality of backup optical environments and each backup environment possesses a second NA and a second OAI. The method comprises steps of providing information with respect to the primary optical environment and the first design rule to an integration system having a calibration database, wherein the calibration database comprises a plurality of mask modification factors and OAI adjustment parameters of the backup optical environments with respect to a plurality of design rules recorded and classified according to a relationship between the design rules, the primary optical environments and the backup optical environments respectively. Then, a plurality of modification rules for backup optical environments respectively are retrieved from the calibration database according to the information. Additionally, a decision for determining whether the first design rule possesses a high demand or a low demand on a product critical dimension is made. When the first design rule has the high demand on the product critical dimension, a plurality of modification rules for the backup optical environments respectively are output, wherein for each backup optical environment, by applying the corresponding modification rule to the backup optical environment, a third critical dimension behavior on another developed photoresist obtained by using the modified backup optical environment is as same as the second critical dimension behavior. On the other hand, when the first design rule has the low demand on the product critical dimension, a plurality of OAI adjustment parameters for the backup optical environments respectively are output, wherein for each backup optical environment, by adjusting the second OAI mode of the backup optical environment to be a third OAI mode based on the OAI adjustment parameter, a fourth critical dimension behavior on another developed photoresist obtained by using the backup optical environment with the mask and the third OAI mode approximates to the second critical dimension behavior.

In the present invention, the first NA is an optimal NA of the primary optical environment and the first NA is larger than the second NA. When the first NA is larger than the second NA, the third OAI mode is stronger than the second OAI mode. Further, each of the modification rules comprises at least one of the mask modification factors for modifying the first critical dimension behavior of the mask used with the corresponding backup optical environment. Also, each of the modification rules further comprises at least one of the OAI adjustment parameters for adjusting the second OAI mode of the corresponding backup optical environment to be a fourth OAI mode and the fourth OAI mode is stronger than the second OAI mode when the first NA is larger than the second NA.

The present invention provides an integration system for providing a set of backup strategies for at least a primary optical environment having a first off-axis illumination (OAI) mode for a fist design rule. Under the primary optical environment with a mask having a first critical dimension behavior on the mask corresponding to the first design rule, a second critical dimension behavior on a developed photoresist is generated, and the backup strategy includes a plurality of backup optical environments and each backup environment possesses a second OAI mode. The integration system comprises means for receiving information with respect to the primary optical environment and the first design rule, means for storing a calibration database, means for retrieving modification rules from the calibration database according to the information, means for determining whether the first rule possess high demand on a product critical dimension or a low demand on the product critical dimension and means for outputting a set of backup strategies. It should be noticed that there are several mask modification factors and OAI adjustment parameters of the backup optical environments with respect to a plurality of design rules in the calibration database. Further, when the first design rule has the high demand on the product critical dimension, the output backup strategies includes a plurality of modification rules for the backup optical environments respectively. Under the same circumstance, for each backup optical environment, by applying the corresponding modification rule to the backup optical environment, a third critical dimension behavior on another developed photoresist obtained by using the modified backup optical environment is as same as the second critical dimension behavior. On the other hand, when the first design rule has the low demand on the product critical dimension, the backup strategies includes a plurality of OAI adjustment parameters for the backup optical environments respectively. Under the same situation, for each backup optical environment, by adjusting the second OAI mode of the backup optical environment to be a third OAI mode based on the OAI adjustment parameter, a fourth critical dimension behavior on another developed photoresist obtained by using the backup optical environment with the mask and the third OAI mode approximates to the second critical dimension behavior.

In the present invention, the first NA is an optimal NA of the primary optical environment. Moreover, in the calibration data base, the mask modification factors and the OAI adjustment parameters of the backup optical environments with respect to a plurality of design rules are classified into a plurality of data pages according to each of the design rules. Also, in each data page, the mask modification factors and the OAI adjustment parameters are classified into a plurality of classes with respect to each of the primary optical environments. Furthermore, in each class, the mask modification factors and the OAI adjustment parameters are sorted into a plurality of groups with respect to each of the backup optical environments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A is a table showing the relationship between the measured critical dimension of each pattern under different optical environment.

FIG. 6A is a table showing the relationship between the measured critical dimension of each pattern under different optical environment.

DESCRIPTION OF THE PREFERRED EMBODIMENTS

In the invention, a novel mixing-and-matching method for scanners and an integration system for mixing and matching scanners are proposed. The scanner matching method according to the invention comprises steps of modifying the standard photomask and/or properly adjusting the off-axis-illumination (OAI) mode of a backup scanner. By properly modifying the standard photomask and/or adjusting OAI mode of the backup scanner, the critical dimension performance of the developed/post-etched pattern formed over a wafer by using the backup scanner is similar to that of the developed/post-etched pattern formed over a wafer by using the primary scanner. Furthermore, the integration system according to the present invention includes a calibration database system for determining a scanner backup strategy once the primary scanner is broken down.

Figure 1:
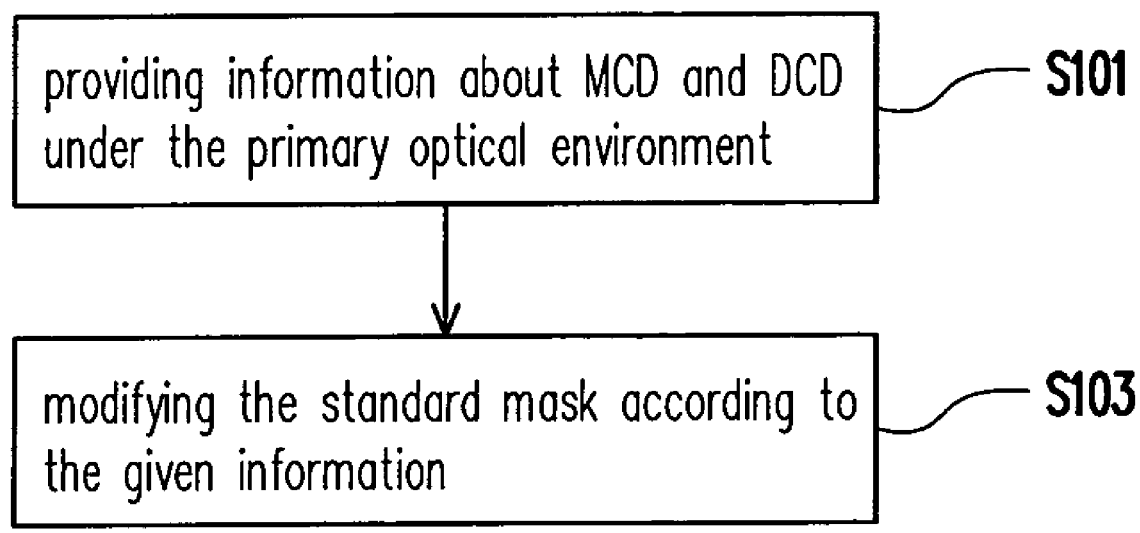
FIG. 1 is a flow chart showing a mixing-matching method for scanners according to one of the preferred embodiments of the present invention.
Figures 2A, 2B:
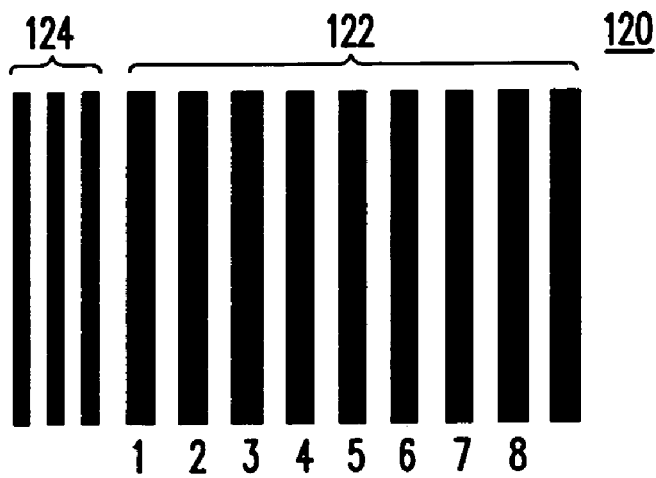
FIG. 2A is a schematic top view of an array pattern on a standard mask.
FIG. 2B is a table showing the relationship between the measured critical dimension of each pattern under different optical environment.
Figure 2C:
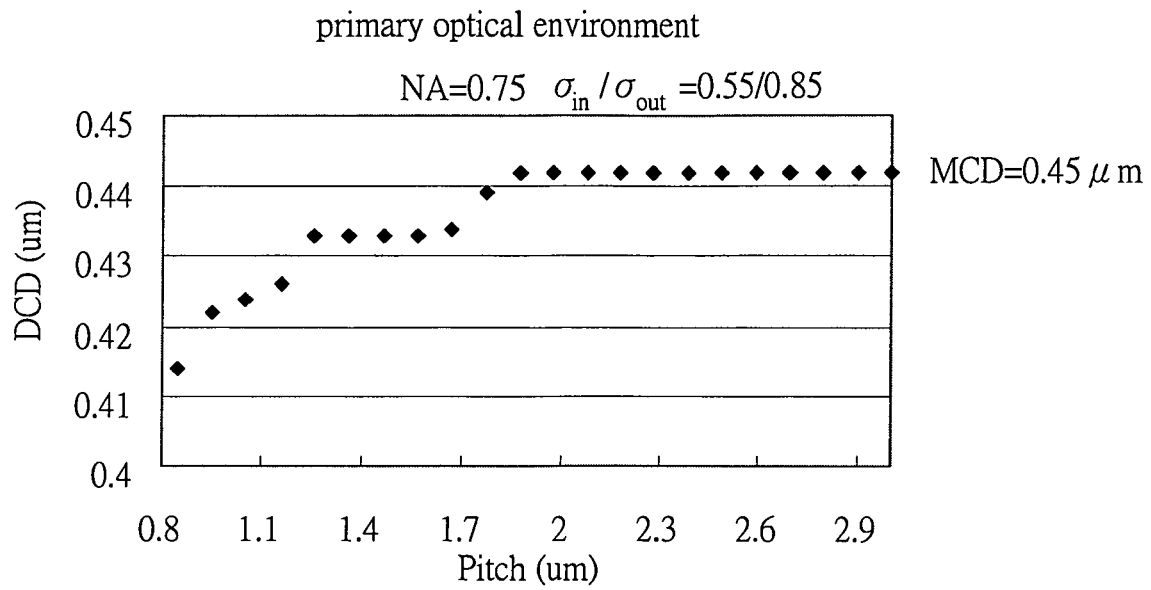
FIGS. 2C and 2D are plot diagrams of result critical dimension of a developed photoresist (DCD) versus pitch.
Figure 2D:
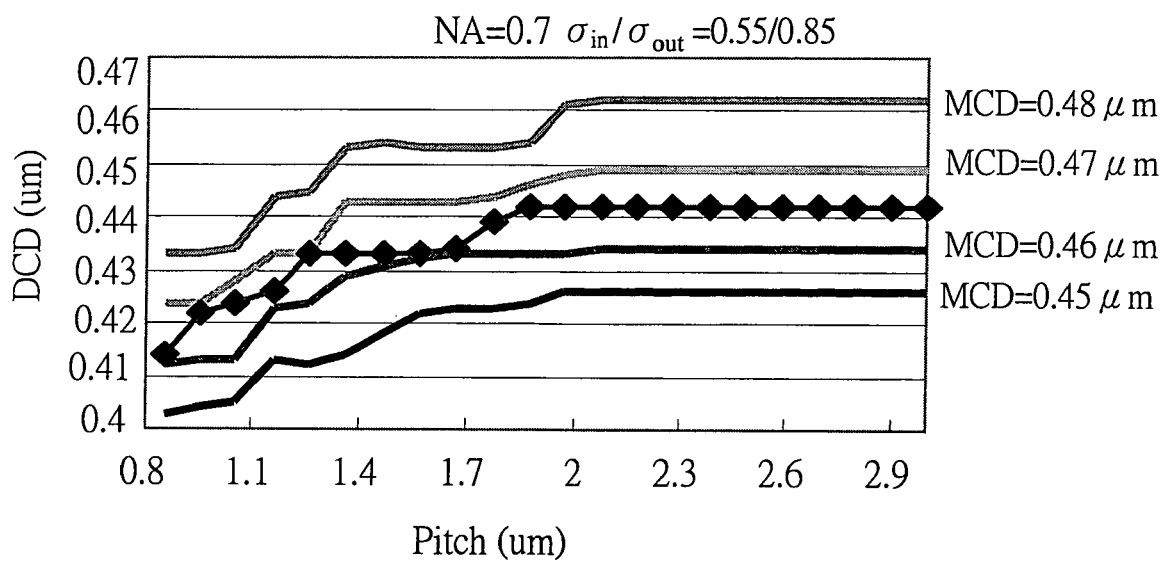

FIG. 1 is a flow chart showing a mixing-matching method for scanners according to one of the preferred embodiments of the present invention. FIG. 2A is a schematic top view of a pattern on a standard mask. FIG. 2B is a table showing the relationship between the measured critical dimension of each pattern under different optical environment. FIGS. 2C and 2D are plot diagrams of result critical dimension of a developed photoresist (DCD) versus pitch. As shown in FIG. 1, in order to obtain the result critical dimension of a developed photoresist (denoted as DCD in later description) formed over a wafer under a backup optical environment as same as that under a primary optical environment, in step S101, the information including critical dimensions of a standard mask (denoted as MCD in later description) for a specific design rule and DCD under the primary optical environment is provided. In step S103, the standard mask for the specific design rule is modified according to the given information. As a result, under a backup optical environment, by using the modified mask, the DCD/critical dimension of an etched process layer (denoted as ECD in later description) behavior of the specific design rule is as same as that under the primary optical environment. It should be notice that the numerical aperture (NA) value of the primary optical environment is higher than that of the backup environment. Furthermore, the primary optical environment can be, for example, a primary scanner and the backup optical environment can be, for example, a scanner other than the primary scanner.

By accompany with FIG. 2A and FIG. 2B, the result of the mixing-and-matching method according to this embodiment of the present invention is described in following in an edge-to-dense proximity point of view. More specifically, as shown in FIG. 2A together with FIG. 2B, a pattern 120 includes an array pattern 122 and a set of assist feature 124 placed aside the array pattern 122. The array pattern 122 shown in FIG. 2A is constructed of several strip type patterns labeled from 1 to 8. Referring to FIG. 2B, the NA value of the primary optical environment can be, for example, 0.75 and the NA value of the backup optical environment can be, for example, 0.70. By using the same standard mask for the specific design rule under the optical environments with different numeral aperture (NA) value, it is obvious that the DCD values of some strip type patterns labeled form 2 to 4 dramatically change under the backup optical environment. However, after the MCD of the standard mask is modified, the DCD performance under the backup optical environment with using the modified standard mask is similar to that under the primary optical environment with using the standard mask.

More over, as shown in FIG. 2C and FIG. 2D, in view of the through-pitch proximity, by mapping the through-pitch DCD behavior represented by curve composed of diamond shape points in both FIG. 2C and FIG. 2D under the primary optical environment with MCD equal to 0.45 μm into the through-pitch DCD behavior under the backup optical environment, it is obvious that the through-pitch DCD behavior under the backup optical environment with MCD between 0.46 μm and 0.47 μm is corresponding with the through-pitch DCD behavior under the primary optical environment. Therefore, by modifying the MCD of standard mask, the through-pitch DCD performance under the backup optical environment is adjusted to meet the DCD performance under the primary optical environment.

As a result, although the mask-error-enhance factors (MEEF) of different optical environment are different from each other, the DCD/ECD performance under the backup optical environment with the modified standard mask is similar to or even as same as that under the primary optical environment.

Figure 3:
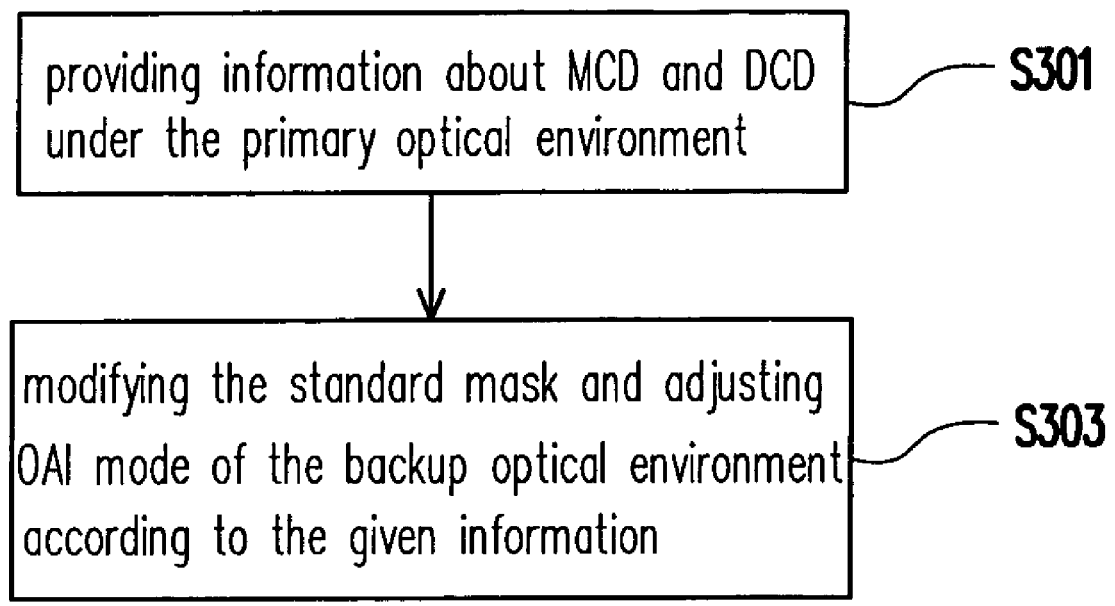
FIG. 3 is a flow chart showing another mixing-matching method for scanners according to one of the preferred embodiments of the present invention.
Figure 4B:
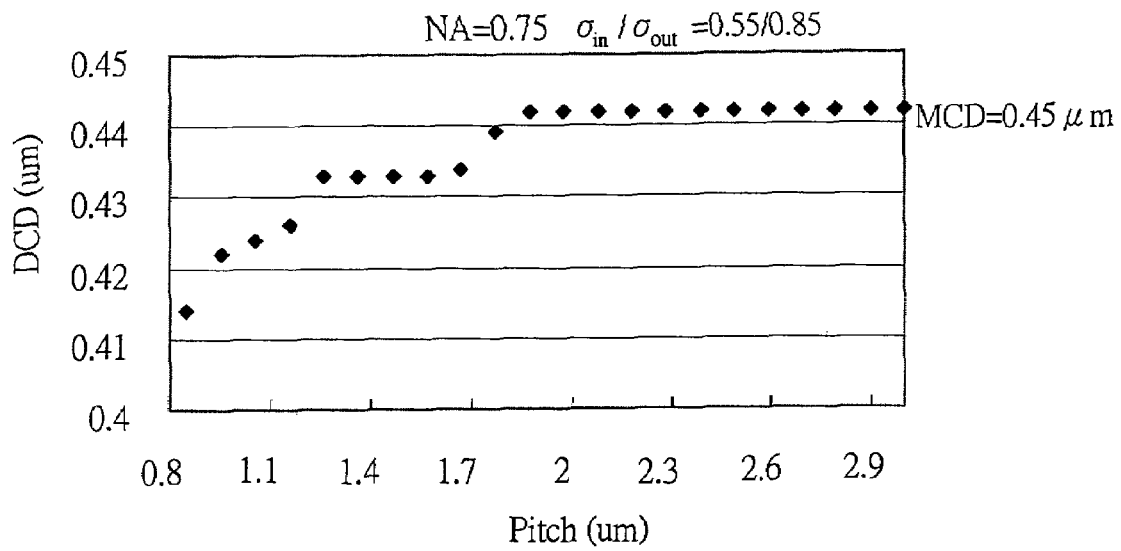
FIGS. 4B and 4C are plot diagrams of DCD versus pitch.
Figure 4C:
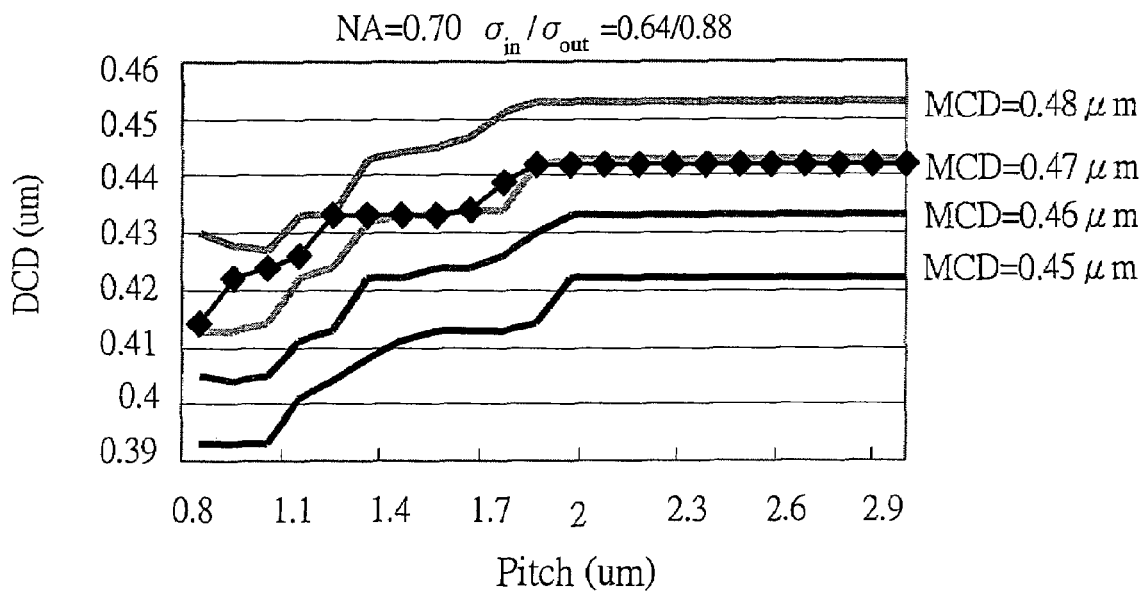

FIG. 3 is a flow chart showing another mixing-matching method for scanners according to one of the preferred embodiments of the present invention. FIG. 4A is a table showing the relationship between the measured critical dimension of each pattern under different optical environment. FIGS. 4B and 4C are plot diagrams of DCD versus pitch. As shown in FIG. 3, in order to obtain the result DCD under a backup optical environment as same as that under a primary optical environment, in step S301, the information including MCD for a specific design rule and DCD under the primary optical environment is provided. In step S303, the standard mask for the specific design rule is modified according to the given information and the OAI mode of the backup optical environment is adjusted according to the given information as well. As a result, under a backup optical environment, by using the modified mask with the adjusted OAI mode, the DCD/ECD behavior of the specific design rule is as same as that under the primary optical environment. It should be notice that the numeral aperture (NA) value of the primary optical environment is higher than that of the backup environment. Furthermore, the primary optical environment can be, for example, a primary scanner and the backup optical environment can be, for example, a scanner other than the primary scanner. More specifically, the OAI mode adjustment process includes a step of adjusting the original OAI mode into a relatively strong OAI mode when the NA of the primary optical environment is larger than that of the backup optical environment.

Figure 8:
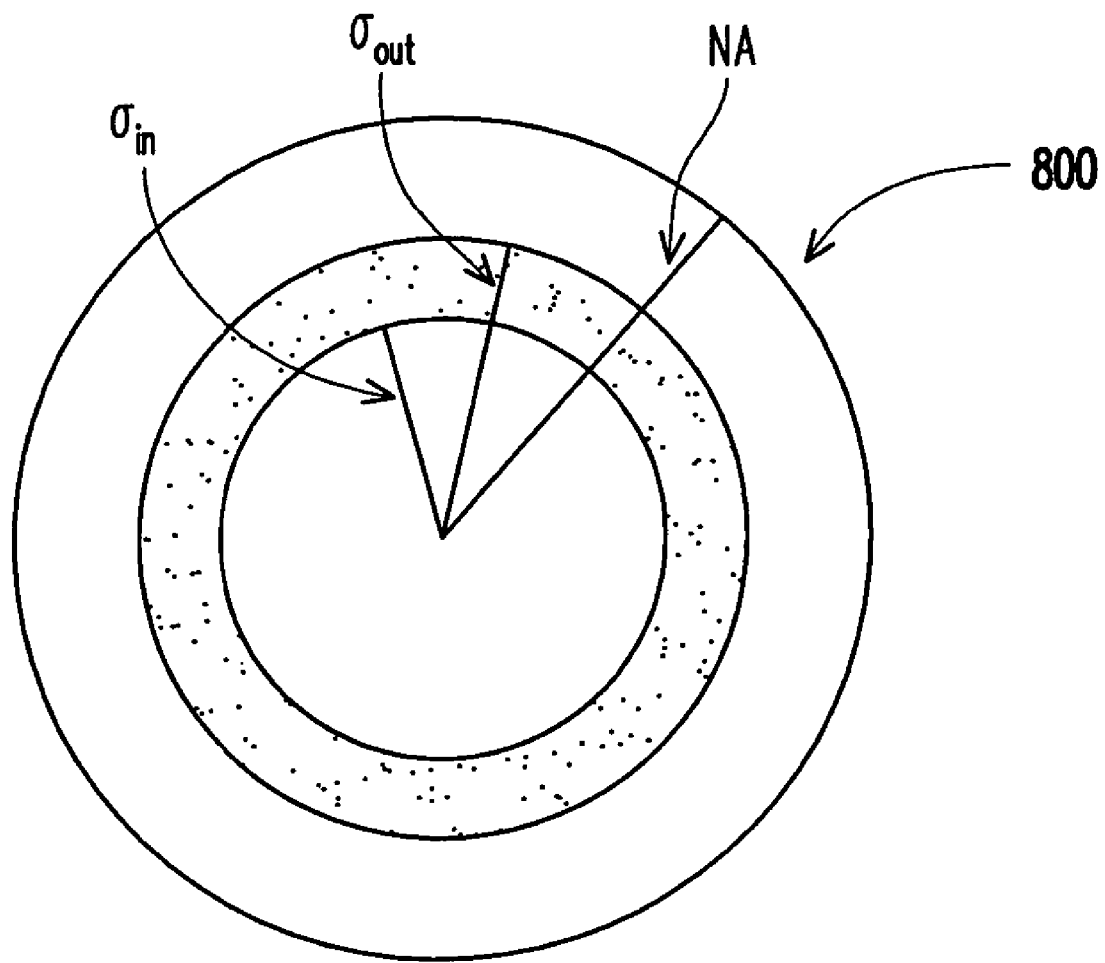
FIG. 8 is a schematic view showing the annular illumination of off-axis illumination system.

Herein, the definition of the relative strong OAI mode is described. Taking the annular OAI system as an example, as shown in FIG. 8, the annular illumination object entering the lens system's pupil 800 possesses two optical values, $\sigma_{in}$ and $\sigma_{out}$, wherein pupil's radius is equal to the NA of the lens system. It should be noticed that σ represents a ratio of the radius of the illumination object to that of the pupil. Therefore, $\sigma_{in}$ indicates ration of the radius of the inner rim of the annual illumination object on the pupil 800 to NA and $\sigma_{out}$ indicates ration of the radius of the outer rim of the annual illumination object on the pupil 800 to NA. Theoretically, for the similar average value of $\sigma_{in}$ and $\sigma_{out}$, the smaller the difference between $\sigma_{in}$ and $\sigma_{out}$ is, the stronger the OAI mode is. Alternatively, for the similar difference between $\sigma_{in}$ and $\sigma_{out}$, the larger the average value of $\sigma_{in}$ and $\sigma_{out}$ is, the stronger the OAI mode is.

By accompany with FIG. 2A and FIG. 4A, the result of the mixing-and-matching method according to this embodiment of the present invention is described in following in an edge-to-dense proximity point of view. More specifically, as shown in FIG. 2A together with FIG. 4A, after the MCD of the standard mask is modified and the OAI mode of the backup optical environment is adjusted to be, for example, 0.88/0.64 ($\sigma_{out}/\sigma_{in}$), the DCD value of each strip type pattern shown in FIG. 2A is of about 130 angstrom. That is, the DCD performance under the backup optical environment with using the modified standard mask and the adjusted OAI mode is similar to that under the primary optical environment with using the standard mask.

More over, as shown in FIG. 4B and FIG. 4C, in view of the through-pitch proximity, by mapping the through-pitch DCD behavior represented by curve composed of diamond shape points in both FIG. 4B and FIG. 4C under the primary optical environment with MCD equal to 0.45 μm into the through-pitch DCD behavior under the backup optical environment, it is obvious that the through-pitch DCD behavior under the backup optical environment with the adjusted OAI mode and MCD of about 0.47 μm is corresponding with the through-pitch DCD behavior under the primary optical environment. Therefore, by modifying the MCD of standard mask, the through-pitch DCD performance under the backup optical environment is adjusted to meet the DCD performance under the primary optical environment.

As a result, although the proximity of the backup optical environment after the OAI mode of the backup optical environment is poor due to relative strong OAI mode, the DCD/ECD performance under the backup optical environment with the modified standard mask and the adjusted OAI mode is similar to or even the same as that under the primary optical environment. Furthermore, because the backup optical environment has relatively strong OAI mode, the MEEF of the backup optical environment is as small as that of the primary optical environment.

Figure 5:
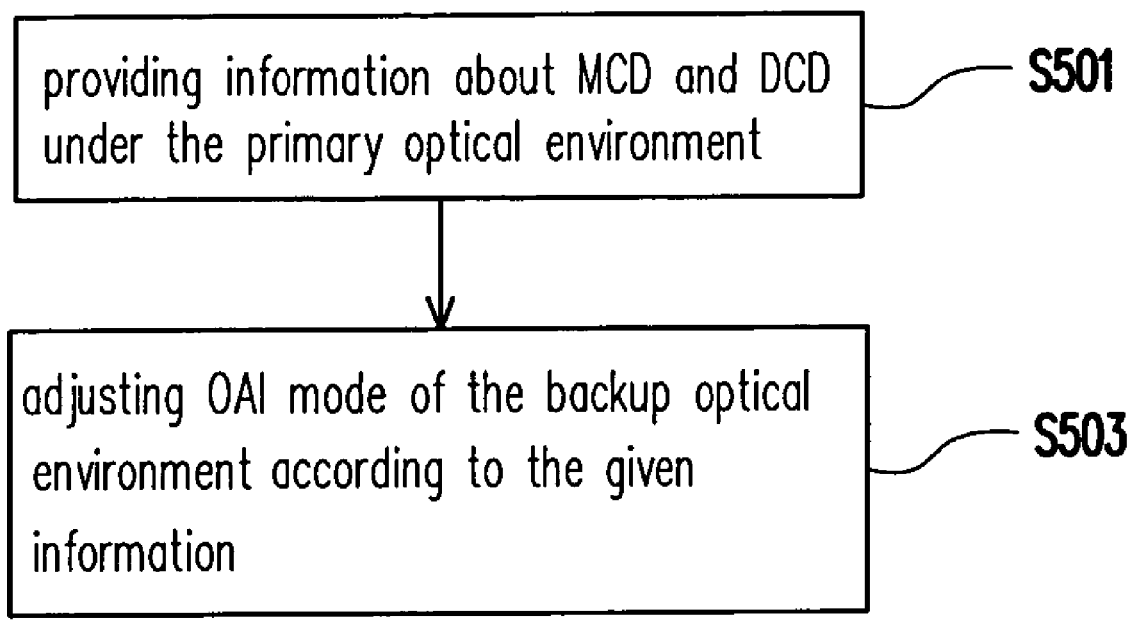
FIG. 5 is a flow chart showing the other mixing-matching method for scanners according to one of the preferred embodiments of the present invention.
Figure 6B:
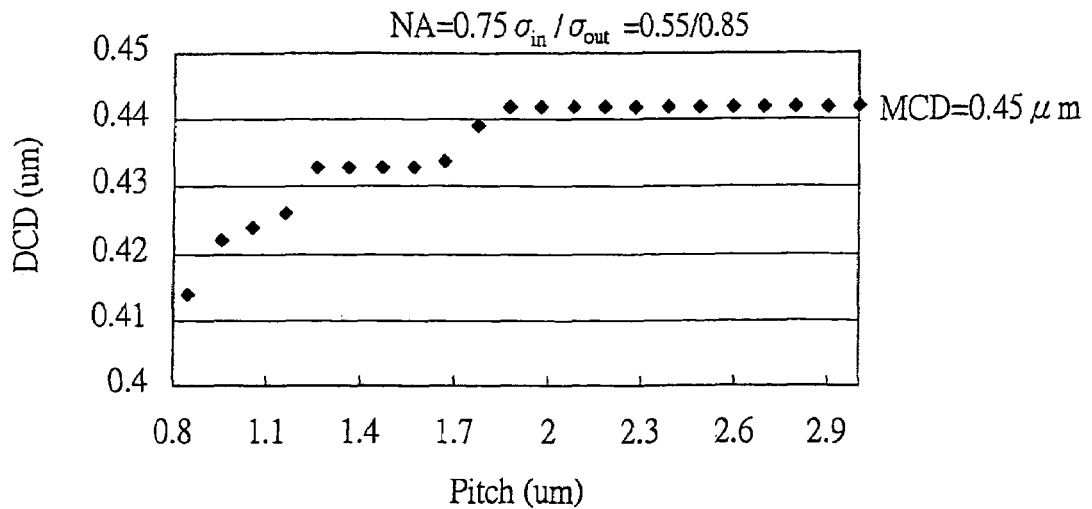
FIGS. 6B and 6C are plot diagrams of DCD of the photoresist versus pitch.
Figure 6C:
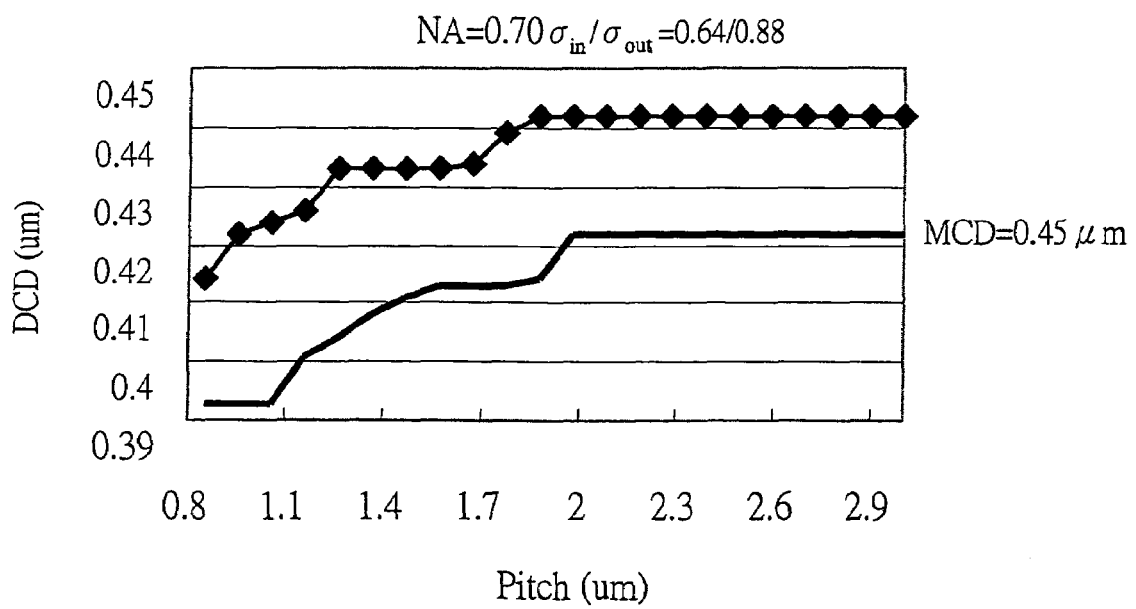

FIG. 5 is a flow chart showing the other mixing-matching method for scanners according to one of the preferred embodiments of the present invention. FIG. 6A is a table showing the relationship between the measured critical dimension of each pattern under different optical environment. FIGS. 6B and 6C are plot diagrams of DCD of the photoresist versus pitch. As shown in FIG. 5, in order to obtain the result DCD under a backup optical environment approximates to that under a primary optical environment, in step S501, the information including MCD for a specific design rule and DCD under the primary optical environment is provided. In step S503, OAI mode of the backup optical environment is adjusted according to the given information. As a result, under a backup optical environment, by using the standard mask with the adjusted OAI mode, the DCD/ECD behavior of the specific design rule approximates to that under the primary optical environment. It should be notice that the numeral aperture (NA) value of the primary optical environment is higher than that of the backup environment. Furthermore, the primary optical environment can be, for example, a primary scanner and the backup optical environment can be, for example, a scanner other than the primary scanner. More specifically, the OAI mode adjustment process includes a step of adjusting the original OAI mode into a relatively strong OAI mode when the NA of the primary optical environment is larger than that of the backup optical environment.

By accompany with FIG. 2A and FIG. 6A, the result of the mixing-and-matching method according to this embodiment of the present invention is described in following in an edge-to-dense proximity point of view. More specifically, as shown in FIG. 2A together with FIG. 6A, after the OAI mode of the backup optical environment is adjusted to be, for example, 0.88/0.64 ($\sigma_{out}/\sigma_{in}$), the DCD value of each strip type pattern shown in FIG. 2A is approximately 130 angstrom. That is, the DCD performance under the backup optical environment with using standard mask and the adjusted OAI mode approximates to that under the primary optical environment with using the standard mask.

More over, as shown in FIG. 5B and FIG. 5C, in view of the through-pitch proximity, by mapping the through-pitch DCD behavior represented by curve composed of diamond shape points in both FIG. 5B and FIG. 5C under the primary optical environment with MCD equal to 0.45 μm into the through-pitch DCD behavior under the backup optical environment, it is obvious that the through-pitch DCD behavior under the primary optical environment with MCD equal to 0.45 μm far diverges from the through-pitch DCD behavior under the backup optical environment with MCD equal to 0.45 μm. It is foreseeable that the proximity of the backup optical environment with adjusted OAI mode far diverges from it supposed to be because strong OAI mode would lead to poor proximity. Nevertheless, under the circumstance that the design rule, such as the design rule for forming metal wire for electrical conduction, does not possess high demands on critical dimension, the cost for modifying the standard mask can be saved by applying this mixing-and-matching method since the DCD/ECD performance under the backup optical environment is approximate enough to that under the primary optical environment.

Figure 7:
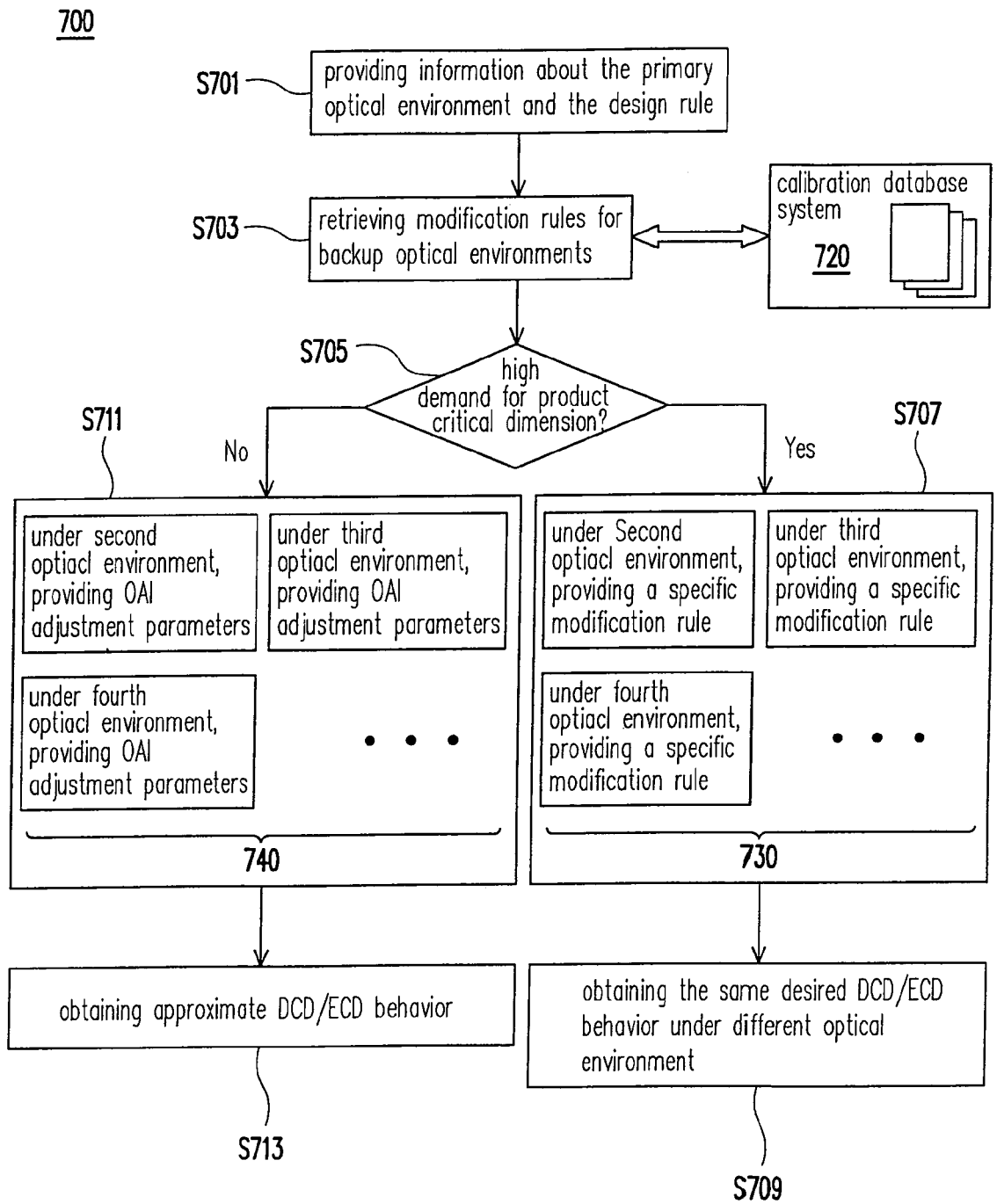
FIG. 7 is a flow chart illustrating an integration system according to one of the preferred embodiment of the present invention.

FIG. 7 is a flow chart illustrating an integration system according to one of the preferred embodiment of the present invention. In light of the mixing-and-matching methods mentioned above, an integration system for mixing and matching scanners and an operation method of the integration system are provided herein. As shown in FIG. 7, an integration system 700 for mixing and matching scanners is provided. The integration system 700 can be stored in a memory storage media and the integration system 700 comprises a calibration database 720. The integration system 700 can be, for example, a computer program code.

Moreover, in the calibration database 720, the data about mask modification factors and OAI adjustment parameters are stored and categorized according to the design rule and the primary optical environment. For example, the data is classified into several data pages according to the design rule of each process layer, the data in each data page is also classified into several classes with respect to each primary optical environment and the data in each primary optical environment is further sorted into several group with respect to each backup optical environment. It should be noticed that the data about mask modification factors and OAI adjustment parameters stored in the calibration database 720 are the history records obtained by applying the mixing-and-matching methods mentioned above.

In the step S701, the information about the primary optical environment and the design rule of the layer which is going to be formed is provided to a receiving means of the integration system 700. The receiving means can be, for example but not limited to, an interface module in a form of computer program code. The information about the primary optical environment can be, for example, the identity number of the primary optical environment or the serial number of the primary optical environment. Further, the information of the design rule of the layer which is going to be formed can be, for example, the identity number of the design rule in the process or the serial number of the design rule in the manufacturing process.

In the step S703, by referring to the given information about the primary optical environment and the design rule of the layer which is going to be formed, a set of the modification rules including the mask modification factors and the OAI adjustment parameters with respect to each backup optical environment can be retrieved from the calibration database 720. In the integration system 700, for example, a data page with respect to the given information about the design rule of the layer which is going to be formed is traced and then a set of modification rules with respect to the given information about the primary optical environment is traced.

In the step S705, a decision for determining whether the given design rule has high demands on critical dimension is made. In the step S707, when the given design rule possesses high demands on critical dimension, a set of modification rules 730 including mask modification factors and OAI adjustment parameters for each backup optical environment with respect to the given primary optical environment are output. Then, in the step S709, by applying a specific modification rule on a corresponding backup optical environment, the DCD/ECD performance under the backup optical environment after applying the specific modification rule is the same as that under the primary optical environment. That is, for each backup optical environment, as long as the standard mask and the OAI mode of the backup optical environment are varied according to the specific modification rule, the resulting DCD/ECD performance/behavior under the backup optical environment with either the modified standard mask or the modified standard mask and the adjusted OAI mode is as same as that under the primary optical environment with the standard mask.

On the other hand, when the given design rule does not possess high demands on critical dimension, in the step S711, a set of OAI adjustment parameters 740 for each backup optical environment with respect to the given primary optical environment are output. Then, in the step S713, by adjusting the OAI modes of the backup optical environments according to the output set of OAI adjustment parameters 740 respectively, the DCD/ECD performance under the backup optical environment after adjusting the OAI mode is the same as that under the primary optical environment. That is, for each backup optical environment, as long as the OAI mode of the backup optical environment is varied according to the output OAI adjustment parameters, the resulting DCD/ECD under the backup optical environment with the standard mask and the adjusted OAI mode approximates to that under the primary optical environment with the standard mask.

It should be noticed that all the steps performed in the integration system 700 can be performed by executing a computer program code via electric calculator, such as computer. Furthermore, the computer program code mentioned above can be a program code consisted of several sub-program code and program segments.

Altogether, when the primary optical environment is broken down or unavailable, by using the mixing-and-matching methods according to the embodiments of the present invention, a backup optical environment with either modified standard mask or both adjusted standard mask and OAI mode can generate the DCD/ECD behavior of the product as same as that of the same product generated by the primary optical environment. Further, when the demand for the critical dimension of certain product is not high, by using the mixing-and-matching method according to the embodiment of the present invention, a backup optical environment with the adjusted OAI mode can generate the DCD/ECD behavior of the product approximating to that of the same product generated by the primary optical environment. Moreover, because the data stored in the calibration database of the integration system is history records obtained by applying the mixing-and-matching methods according to the present invention, by proving the information of the primary optical environment and the design rule of the product to the integration system, the integration system can output a set of backup strategies according to the given information by retrieving the modification rules with respect to the given information from the calibration database. Therefore, even though the primary optical environment is broken down or unavailable, the users can quickly find out the backup strategies and the lost caused by breakdown primary optical environment can be compensated by using backup optical environment with properly physical adjustment. Hence, the product throughput is not affected by the breakdown primary optical environment.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A mixing-and-matching method for an optical environment group, wherein the optical environment group has a primary optical environment having a first numerical aperture (NA) and a first off-axis illumination (OAI) mode and at least one backup optical environment having a second NA and a second OAI mode, the method comprising:

providing information including a first critical dimension behavior on a mask with respect to a design rule and a second critical dimension behavior on a developed photoresist obtained by using the primary optical environment with the mask; and modifying the mask to convert the first critical dimension behavior into a third critical dimension behavior according to the information, wherein a fourth critical dimension behavior on another developed photoresist obtained by using the backup optical environment with the modified mask having the third critical dimension behavior is as same as the second critical dimension behavior.

2. The mixing-and-matching method of claim 1, wherein the first NA is an optimal NA of the primary optical environment.

3. The mixing-and-matching method of claim 1, wherein the first NA is larger than the second NA.

4. The mixing-and-matching method of claim 1, wherein the step of modifying the mask further comprises a step of adjusting the second OAI mode of the backup optical environment to be a third OAI mode.

5. The mixing-and-matching method of claim 4, wherein the third OAI mode is stronger than the second OAI mode when the first NA is larger than the second NA.

6. A mixing-and-matching method for an optical environment group, wherein the optical environment group has a primary optical environment having a first numerical aperture (NA) and a first off-axis illumination (OAI) mode and at least one backup optical environment having a second NA and a second OAI mode, the method comprising:

providing information including a first critical dimension behavior on a mask with respect to a design rule and a second critical dimension behavior on a developed photoresist obtained by using the primary optical environment with the mask;

modifying the mask to convert the first critical dimension behavior into a third critical dimension behavior according to the information when the design rule possesses a high demand on a product critical dimension, wherein a fourth critical dimension behavior on another developed photoresist obtained by using the backup optical environment with the modified mask having the third critical dimension behavior is as same as the second critical dimension behavior; and adjusting the second OAI mode of the backup optical environment to be a third OAI mode when the design rule possesses a low demand on the product critical dimension, wherein a fifth critical dimension behavior on another developed photoresist obtained by using the backup optical environment with the mask and the third OAI mode approximates to the second critical dimension behavior.

7. The mixing-and-matching method of claim 6, wherein the first NA is an optimal NA of the primary optical environment.

8. The mixing-and-matching method of claim 6, wherein the first NA is larger than the second NA.

9. The mixing-and-matching method of claim 6, wherein the step of modifying the mask further comprises a step of adjusting the second OAI mode of the backup optical environment to be a fourth OAI mode.

10. The mixing-and-matching method of claim 9, wherein the fourth OAI mode is stronger than the second OAI mode when the first NA is larger than the second NA.

11. The mixing-and-matching method of claim 6, wherein the third OAI mode is stronger than the second OAI mode when the first NA is larger than the second NA.

12. A method for providing a backup strategy for a primary optical environment having a first numerical aperture (NA) and a first off-axis illumination (OAI) mode for a fist design rule, wherein under the primary optical environment with a mask having a first critical dimension behavior on the mask corresponding to the first design rule, a second critical dimension behavior on a developed photoresist is generated, and the backup strategy includes a plurality of backup optical environments and each backup optical environment possesses a second NA and a second OAI mode, the method comprising:

providing information with respect to the primary optical environment and the first design rule to an integration system having a calibration database, wherein the calibration database comprises a plurality of mask modification factors and OAI adjustment parameters of the plurality of backup optical environments with respect to a plurality of design rules recorded and classified according to a relationship between the design rules, the primary optical environments and the plurality of backup optical environments respectively;

retrieving a plurality of modification rules for plurality of backup optical environments respectively from the calibration database according to the information;

determining whether the first design rule possesses a high demand or a low demand on a product critical dimension;

outputting a plurality of modification rules for the plurality of backup optical environments respectively when the first design rule has the high demand on the product critical dimension, wherein for each backup optical environment, by applying a corresponding modification rule to modify the backup optical environment, a third critical dimension behavior on another developed photoresist obtained by using the modified backup optical environment is as same as the second critical dimension behavior; and outputting a plurality of OAI adjustment parameters for the plurality of backup optical environments respectively when the first design rule has the low demand on the product critical dimension, wherein for each backup optical environment, by adjusting the second OAI mode of the each backup optical environment to be a third OAI mode based on a corresponding OAI adjustment parameter, a fourth critical dimension behavior on another developed photoresist obtained by using the each backup optical environment with the mask and the third OAI mode approximates to the second critical dimension behavior.

13. The method of claim 12, wherein the first NA is one optimal NA of the primary optical environment.

14. The method of claim 12, wherein the first NA is larger than the second NA.

15. The method of claim 12, wherein each of the plurality of modification rules comprises at least one of the plurality of mask modification factors for modifying the first critical dimension behavior of the mask used with a corresponding backup optical environment.

16. The method of claim 15, wherein each of the plurality of modification rules further comprises at least one of the plurality of OAI adjustment parameters for adjusting the second OAI mode of the corresponding backup optical environment to be a fourth OAI mode.

17. The method of claim 16, wherein the fourth OAI mode is stronger than the second OAI mode when the first NA is larger than the second NA.

18. The method of claim 12, wherein the third OAI mode is stronger than the second OAI mode when the first NA is larger than the second NA.

19. An integration system for providing a set of backup strategies for a primary optical environment having a first numerical aperture (NA) and a first off-axis illumination (OAI) mode for a fist design rule, wherein under the primary optical environment with a mask having a first critical dimension behavior on the mask corresponding to the first design rule, a second critical dimension behavior on a developed photoresist is generated, and each backup strategy of the set of the backup strategies includes a plurality of backup optical environments and each backup optical environment possesses a second OAI mode, the integration system comprising:

means for receiving information with respect to the primary optical environment and the first design rule;

means for storing a calibration database, wherein a plurality of mask modification factors and OAI adjustment parameters of the plurality of backup optical environments with respect to a plurality of design rules are recorded in the calibration database;

means for retrieving modification rules from the calibration database according to the information;

means for determining whether the first design rule possess high demand on a product critical dimension or a low demand on the product critical dimension;

means for outputting the set of backup strategies, wherein when the first design rule has the high demand on the product critical dimension, the set of backup strategies includes a plurality of modification rules for the plurality of backup optical environments respectively, and for each backup optical environment, by applying a corresponding modification rule to modify the each backup optical environment, a third critical dimension behavior on another developed photoresist obtained by using the modified backup optical environment is as same as the second critical dimension behavior; and when the first design rule has the low demand on the product critical dimension, the plurality of backup strategies includes a plurality of OAI adjustment parameters for the plurality of backup optical environments respectively, and for each backup optical environment, by adjusting the second OAI mode of the each backup optical environment to be a third OAI mode based on a corresponding OAI adjustment parameter, a fourth critical dimension behavior on another developed photoresist obtained by using the each backup optical environment with the mask and the third OAI mode approximates to the second critical dimension behavior.

20. The integration system of claim 19, wherein the first NA is an optimal NA of the primary optical environment.

21. The integration system of claim 19, wherein in the calibration data base, the plurality of mask modification factors and the plurality of OAI adjustment parameters of the plurality of backup optical environments with respect to a plurality of design rules are classified into a plurality of data pages according to each of the design rules.

22. The integration system of claim 21, wherein in each data page, the plurality of mask modification factors and the plurality of OAI adjustment parameters are classified into a plurality of classes with respect to each of the primary optical environments.

23. The integration system of claim 22, wherein in each class, the plurality of mask modification factors and the plurality of OAI adjustment parameters are sorted into a plurality of groups with respect to each of the backup optical environments.

* * * * *